(12) United States Patent
Ramdani et al.

(10) Patent No.: US 8,928,037 B2
(45) Date of Patent: Jan. 6, 2015

(54) HETEROSTRUCTURE POWER TRANSISTOR WITH ALSIN PASSIVATION LAYER

(71) Applicant: Power Integrations, Inc., San Jose, CA (US)

(72) Inventors: Jamal Ramdani, Raritan, NJ (US); Michael Murphy, Middlesex, NJ (US); John Paul Edwards, Verona, NJ (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 13/780,192

(22) Filed: Feb. 28, 2013

(65) Prior Publication Data

US 2014/0239309 A1     Aug. 28, 2014

(51) Int. Cl.
*H01L 29/66*  (2006.01)
*H01L 29/20*  (2006.01)
*H01L 21/02*  (2006.01)

(52) U.S. Cl.
CPC ...... *H01L 21/02107* (2013.01); *H01L 29/2003* (2013.01)
USPC ............. 257/192; 257/194; 257/E29.246; 257/E29.252

(58) Field of Classification Search
CPC . H01L 29/517; H01L 29/518; H01L 29/2009; H01L 29/42316
USPC ............. 257/192, 194, E29.246, E29.252
See application file for complete search history.

(56) References Cited

U.S. PATENT DOCUMENTS

| | | | |
|---|---|---|---|
| 3,775,200 A | 11/1973 | De Nobel et al. | |
| 4,142,195 A | 2/1979 | Carlson et al. | |
| 4,233,617 A | 11/1980 | Klaassen et al. | |
| 4,408,216 A | 10/1983 | Gould | |
| 4,543,595 A | 9/1985 | Vora | |
| 4,745,445 A | 5/1988 | Mun et al. | |
| 4,946,547 A | 8/1990 | Palmour et al. | |
| 4,967,243 A | 10/1990 | Baliga et al. | |

(Continued)

FOREIGN PATENT DOCUMENTS

| | | |
|---|---|---|
| CN | 101689561 | 3/2010 |
| EP | 0081414 | 6/1983 |

(Continued)

OTHER PUBLICATIONS

Arulkumaran et al. "Studies on the Influences of I-GaN, N-GaN, P-GaN and InGaN Cap Layers in AlGaN/GaN High-Electron-Mobility Transistors," Japanese Journal of Applied Physics, Japan Society of Applied Physics, JP, vol. 44, No. 5A, May 10, 2005, pp. 2953-2960, XP001502490, ISSN: 0021-4922.

(Continued)

*Primary Examiner* — Matthew W Such
*Assistant Examiner* — Stephen C Smith
(74) *Attorney, Agent, or Firm* — The Law Offices of Bradley J. Bereznak

(57) ABSTRACT

A heterostructure semiconductor device includes a first active layer and a second active layer disposed on the first active layer. A two-dimensional electron gas layer is formed between the first and second active layers. An AlSiN passivation layer is disposed on the second active layer. First and second ohmic contacts electrically connect to the second active layer. The first and second ohmic contacts are laterally spaced-apart, with a gate being disposed between the first and second ohmic contacts.

23 Claims, 5 Drawing Sheets

(56) References Cited

U.S. PATENT DOCUMENTS

| | | |
|---|---|---|
| 5,200,022 A | 4/1993 | Kong et al. |
| 5,602,418 A | 2/1997 | Imai et al. |
| 5,612,567 A | 3/1997 | Baliga |
| 5,686,738 A | 11/1997 | Moustakas |
| 5,689,128 A | 11/1997 | Hshieh et al. |
| 5,741,724 A | 4/1998 | Ramdani et al. |
| 5,785,606 A | 7/1998 | Marquez |
| 5,874,747 A | 2/1999 | Redwing et al. |
| 5,877,558 A | 3/1999 | Nakamura et al. |
| 6,051,340 A | 4/2000 | Kawakami et al. |
| 6,078,090 A | 6/2000 | Williams et al. |
| 6,121,121 A | 9/2000 | Koide |
| 6,139,628 A | 10/2000 | Yuri et al. |
| 6,146,457 A | 11/2000 | Solomon |
| 6,184,570 B1 | 2/2001 | MacDonald, Jr. et al. |
| 6,211,018 B1 | 4/2001 | Nam et al. |
| 6,239,033 B1 | 5/2001 | Kawai |
| 6,329,677 B1 | 12/2001 | Oguri et al. |
| 6,331,450 B1 | 12/2001 | Uemura |
| 6,344,665 B1 | 2/2002 | Sung et al. |
| 6,380,108 B1 | 4/2002 | Linthicum et al. |
| 6,389,051 B1 | 5/2002 | Van de Walle |
| 6,432,579 B1 | 8/2002 | Tsuji et al. |
| 6,437,374 B1 | 8/2002 | Northrup et al. |
| 6,492,669 B2 | 12/2002 | Nakayama et al. |
| 6,507,041 B2 | 1/2003 | Nakamura et al. |
| 6,515,308 B1 | 2/2003 | Kneissl et al. |
| 6,518,079 B2 | 2/2003 | Imler |
| 6,524,900 B2 | 2/2003 | Dahlqvist et al. |
| 6,573,537 B1 | 6/2003 | Steigerwald et al. |
| 6,586,777 B1 | 7/2003 | Yuasa et al. |
| 6,586,781 B2 | 7/2003 | Wu et al. |
| 6,593,597 B2 | 7/2003 | Sheu |
| 6,605,854 B2 | 8/2003 | Nagase et al. |
| 6,608,327 B1 | 8/2003 | Davis et al. |
| 6,610,995 B2 | 8/2003 | Nakamura et al. |
| 6,624,444 B1 | 9/2003 | Li |
| 6,627,967 B2 | 9/2003 | Asano et al. |
| 6,649,995 B2 | 11/2003 | Tooi et al. |
| 6,656,823 B2 | 12/2003 | Lee et al. |
| 6,685,804 B1 | 2/2004 | Ikeda et al. |
| 6,768,146 B2 | 7/2004 | Yoshida |
| 6,809,375 B2 | 10/2004 | Takemori et al. |
| 6,855,970 B2 | 2/2005 | Hatakeyama et al. |
| 6,949,401 B2 | 9/2005 | Kaminski et al. |
| 6,949,774 B2 | 9/2005 | Parikh et al. |
| 7,026,665 B1 | 4/2006 | Smart et al. |
| 7,033,854 B2 | 4/2006 | Morita |
| 7,041,579 B2 | 5/2006 | Barsky et al. |
| 7,084,456 B2 | 8/2006 | Williams et al. |
| 7,084,475 B2 | 8/2006 | Shelton et al. |
| 7,109,551 B2 | 9/2006 | Sugi et al. |
| 7,115,896 B2 | 10/2006 | Gao et al. |
| 7,116,567 B2 | 10/2006 | Shelton et al. |
| 7,118,970 B2 | 10/2006 | Das et al. |
| 7,220,661 B1 | 5/2007 | Yu et al. |
| 7,229,866 B2 | 6/2007 | Zhu et al. |
| 7,235,330 B1 | 6/2007 | Fujimoto et al. |
| 7,238,976 B1 | 7/2007 | Yu et al. |
| 7,253,015 B2 | 8/2007 | Pophristic et al. |
| 7,323,402 B2 | 1/2008 | Chiola |
| 7,329,587 B2 | 2/2008 | Bruedler et al. |
| 7,417,266 B1 | 8/2008 | Li et al. |
| 7,476,956 B2 | 1/2009 | Parikh et al. |
| 7,547,928 B2 | 6/2009 | Germain et al. |
| 7,638,818 B2 | 12/2009 | Wu et al. |
| 7,696,540 B2 | 4/2010 | Francis et al. |
| 7,696,598 B2 | 4/2010 | Francis et al. |
| 7,863,172 B2 | 1/2011 | Zhu et al. |
| 7,939,853 B2 | 5/2011 | Murphy et al. |
| 8,026,568 B2 | 9/2011 | Zhu et al. |
| 8,097,512 B2 | 1/2012 | Li et al. |
| 8,169,003 B2 | 5/2012 | Murphy et al. |
| 8,399,911 B2 | 3/2013 | Derluyn et al. |
| 8,592,866 B2 * | 11/2013 | Yanagihara et al. .......... 257/194 |
| 8,592,868 B2 * | 11/2013 | Heikman et al. ............. 257/194 |
| 2001/0001494 A1 | 5/2001 | Kocon |
| 2002/0015833 A1 | 2/2002 | Takahashi et al. |
| 2003/0015708 A1 | 1/2003 | Parikh et al. |
| 2003/0020135 A1 | 1/2003 | Kaminski et al. |
| 2003/0062525 A1 | 4/2003 | Parikh et al. |
| 2003/0098462 A1 | 5/2003 | Yoshida |
| 2004/0016965 A1 | 1/2004 | Ui et al. |
| 2004/0021152 A1 | 2/2004 | Nguyen et al. |
| 2004/0119063 A1 | 6/2004 | Guo et al. |
| 2005/0087763 A1 | 4/2005 | Kanda et al. |
| 2005/0127754 A1 | 6/2005 | Muth |
| 2005/0151255 A1 | 7/2005 | Ando et al. |
| 2005/0179104 A1 | 8/2005 | Shelton et al. |
| 2005/0179106 A1 | 8/2005 | Asano et al. |
| 2005/0179107 A1 | 8/2005 | Pophristic et al. |
| 2005/0194610 A1 | 9/2005 | Souma et al. |
| 2005/0202661 A1 | 9/2005 | Ceruzzi et al. |
| 2005/0215012 A1 | 9/2005 | Williams et al. |
| 2005/0242365 A1 | 11/2005 | Yoo |
| 2006/0081948 A1* | 4/2006 | Lim et al. .................... 257/410 |
| 2006/0108606 A1 | 5/2006 | Saxler et al. |
| 2006/0145283 A1 | 7/2006 | Zhu et al. |
| 2006/0151868 A1 | 7/2006 | Zhu et al. |
| 2006/0186422 A1 | 8/2006 | Gaska et al. |
| 2006/0197107 A1 | 9/2006 | Kanamura et al. |
| 2006/0244010 A1 | 11/2006 | Saxler |
| 2006/0261356 A1 | 11/2006 | Iwakami et al. |
| 2006/0261384 A1 | 11/2006 | Rueb et al. |
| 2007/0114569 A1 | 5/2007 | Wu et al. |
| 2007/0228415 A1 | 10/2007 | Kanamura et al. |
| 2009/0191674 A1 | 7/2009 | Germain et al. |
| 2009/0278233 A1 | 11/2009 | Pinnington et al. |
| 2010/0012977 A1 | 1/2010 | Derluyn et al. |
| 2010/0025730 A1 | 2/2010 | Heikman et al. |
| 2010/0176421 A1 | 7/2010 | Van Hove et al. |
| 2010/0330754 A1 | 12/2010 | Hebert |
| 2011/0101370 A1 | 5/2011 | Cheng et al. |
| 2011/0156212 A1 | 6/2011 | Arena |
| 2011/0272742 A1 | 11/2011 | Akiyama et al. |
| 2012/0112263 A1 | 5/2012 | Tanaka et al. |
| 2012/0153301 A1* | 6/2012 | Shealy et al. .................... 257/77 |
| 2012/0156836 A1* | 6/2012 | Shealy et al. .................. 438/172 |
| 2012/0156895 A1* | 6/2012 | Shealy et al. .................. 438/786 |
| 2012/0319169 A1* | 12/2012 | Van Hove ..................... 257/194 |

FOREIGN PATENT DOCUMENTS

| | | |
|---|---|---|
| EP | 0514018 | 11/1992 |
| EP | 1612866 | 1/2006 |
| EP | 1643561 | 4/2006 |
| FR | 2844099 | 3/2004 |
| FR | 2857982 | 1/2005 |
| JP | 11040847 | 2/1992 |
| JP | 08050922 | 2/1996 |
| JP | 09306504 | 11/1997 |
| JP | 11135115 | 5/1999 |
| JP | 11145514 | 5/1999 |
| JP | 2000216409 | 8/2000 |
| JP | 2000512075 | 9/2000 |
| JP | 2001357855 | 12/2001 |
| JP | 2002064201 | 2/2002 |
| JP | 2002083594 | 3/2002 |
| JP | 2003506903 | 2/2003 |
| JP | 2003243323 | 8/2003 |
| JP | 2004087587 | 3/2004 |
| JP | 2004186558 | 7/2004 |
| JP | 2005209377 | 8/2005 |
| JP | 2005317843 | 11/2005 |
| JP | 2006155959 | 6/2006 |
| WO | 9641906 | 12/1996 |
| WO | 0131722 | 5/2001 |

(56) References Cited

FOREIGN PATENT DOCUMENTS

| WO | 0143174 | 6/2001 |
|---|---|---|
| WO | 03032397 | 4/2003 |

OTHER PUBLICATIONS

Yoshida et al. "A New GaN Based Field Effect Schottky Barrier Diode with a Very Low On-Voltage Operation," Proceedings of 2004 Power Semiconductor Devices & ICs, Kitakyushu, May 24, 2004, pp. 323-326, XP010723404, ISBN: 978-4-88686-060-6.

Hashizume Tamotsu et al. "Chemisty and Electrical Properties of Surfaces of GaN and GaN/AlGaN Heterostructures," Journal of Vacuum Science and Technology: Part B, AVS/AIP, Melville, New York, NY, US, vol. 19, No. 4, Jul. 1, 2001, pp. 1675-1681, XP012008931.

\* cited by examiner

US 8,928,037 B2

HETEROSTRUCTURE POWER TRANSISTOR WITH ALSIN PASSIVATION LAYER

TECHNICAL FIELD

The present invention relates generally to high-voltage field effect transistors (FETs); more specifically, to high-electron-mobility transistors (HEMTs) and heterostructure field-effect transistors (HFETs), and to methods of fabricating such power transistor devices.

BACKGROUND

One type of high-voltage FET is a heterostructure FET (HFET), also referred to as a heterojunction or high-electron mobility transistor (HEMT). HFETs based on gallium nitride (GaN) and other wide bandgap direct transitional semiconductor materials, such as silicon carbide (SIC), are advantageously utilized in certain electronic devices due to their superior physical properties over silicon-based devices. For example, GaN and AlGaN/GaN transistors are commonly used in high-speed switching and high-power applications (e.g., power switches and power converters) due to the high electron mobility, high breakdown voltage, and high saturation electron velocity characteristics offered by GaN-based materials and device structures. Due to the HFETs physical properties, HFETs may change states substantially faster than other semiconductor switches that conduct the same currents at the same voltages and the wide bandgap may improve performance of the HFET at elevated temperatures.

GaN-based HFETs devices are typically fabricated by epitaxial growth on substrate semiconductor materials such as silicon, sapphire and silicon carbide formed into a thin disk or wafer. The fabrication steps for forming electronic devices (e.g., transistors) directly in the semiconductor material are frequently referred to as front-end-of-line (FEOL) processing. During FEOL processing of an HFET, the wafer may be moved from various machines to build the various material layers of the device structure. But because GaN is a piezo-electric material, GaN-based HFET devices are susceptible to charge build-up (positive or negative) during FEOL processing. For example, charge build-up may result from the passivation process which involves deposition or growth of dielectric layers on the surface of a semiconductor. Passivation may be utilized to provide electrical stability by isolating the surface of the wafer from electrical and chemical conditions in the environment. For instance, exposure to air during fabrication of the HFET can cause surface reactions such as oxidation to occur which may impact the overall performance of the HFET device.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
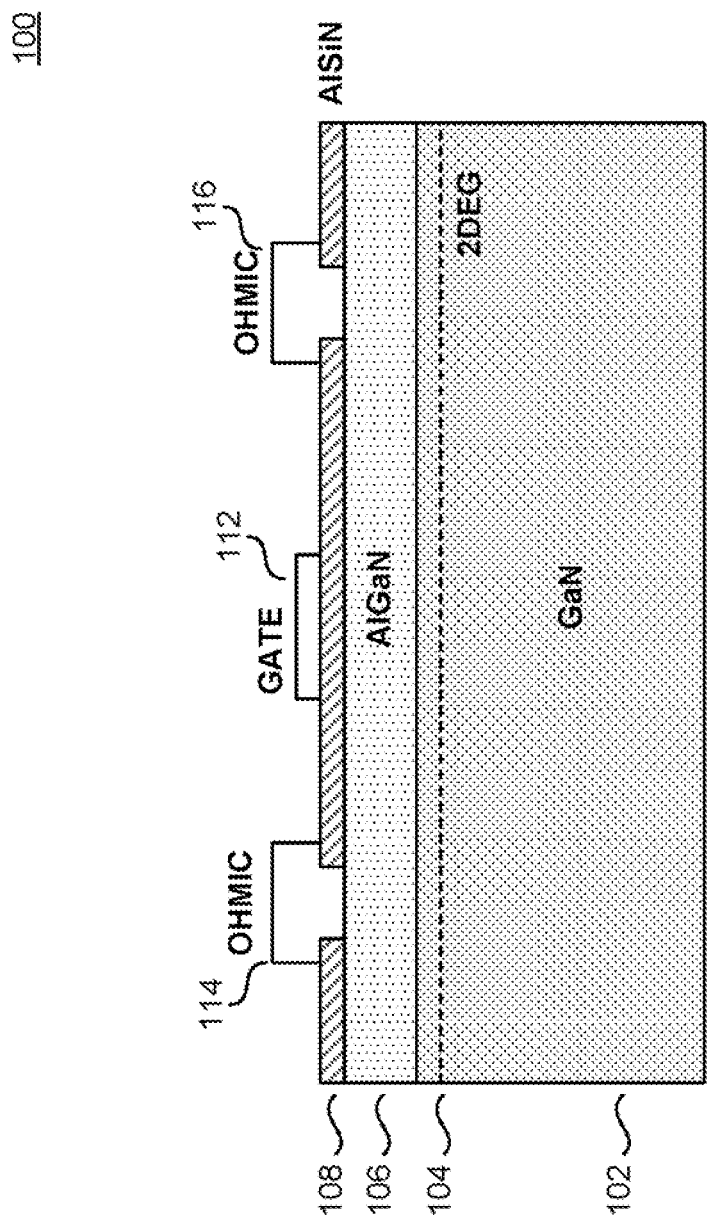
FIG. 1 is a cross-sectional side view of an example semiconductor device having a passivation structure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", an embodiment", "one example" or "an example" means that a particular feature, structure or characteristic described in connection with the embodiment or example is included in at least one embodiment of the present invention. Thus, appearances of the phrases "in one embodiment", in an embodiment, "one example" or "an example" in various places throughout this specification are not necessarily all referring to the same embodiment or example. Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

In the descriptions below, an example HFET is used for the purpose of explanation. However, it should be appreciated that embodiments of the present invention may be utilized with other types of FETs, such as a metal oxide semiconductor FET (MOSFET) or metal insulator semiconductor FET (MISFET) devices.

As mentioned above, sheet charge may accumulate on the wafer of HFET devices during fabrication processing. To combat the effects of accumulated surface charge and to protect the HFET devices from other environmental conditions, one or more layers of dielectric material may be used as a passivation layer that protects the surface of the HFET.

In accordance with embodiments of the present invention, a GaN-based HFET device structure and method of fabricating the same is disclosed which utilizes a new material combination based on aluminum silicon nitride (AlSiN) to passivate a GaN surface of a HFET device. In one embodiment, the AlSiN layer functions both as a passivation layer and a gate dielectric in the HFET device. Compared with traditional passivation materials, the wider bandgap of AlSiN when used in the HFET structure described herein may minimize current collapse during switching, reduce gate leakage, and provide enhanced gate reliability and stability.

In one embodiment, the HFET device has first and second active layers with a two-dimensional electron gas layer forming therebetween. A passivation layer of AlSiN (e.g., AlSi₃N₄) is disposed on the second active layer. The AlSiN passivation layer may also serve as a first gate dielectric layer. (In the present disclosure, this dual function layer is also referred to as a passivation/first gate dielectric layer.) In a further embodiment, a second gate dielectric layer is disposed on the first gate dielectric layer. In one example, aluminum oxide (Al₂O₃) is utilized for the second gate dielectric layer. In other embodiments, one or more additional layers are formed over the second gate dielectric layer. A gate member is disposed above the AlSiN passivation layer. Ohmic contacts (source and drain) of the device extend down to the second active layer.

FIG. 1 illustrates a cross-sectional side view of an example semiconductor device 100, i.e., a HFET device, which includes a first active layer 102, also referred to as a channel layer, a second active layer 106, also called a barrier or donor layer, a passivation layer 108, a gate 112, and respective source and drain ohmic contacts 114 and 116. Respective source and drain ohmic contacts 114 and 116 are shown extending vertically down through passivation layer 108 to electrically connect to second active layer 106. As shown, source and drain ohmic contacts 114 & 116 are laterally spaced-apart, with gate 114 being disposed between source and drain ohmic contacts 116 & 118.

Further shown in FIG. 1 is an electrical charge layer 104 which is formed between the first active layer 102 and the second active layer 106. The electrical charge layer 104 is sometimes referred to as a two-dimensional electron gas (2DEG) layer 104. The 2DEG layer 104 defines a lateral conductive channel for the HFET device. The 2DEG layer 104 forms due to the bandgap difference between the two active layers. In particular, the 2DEG layer 104 forms due to the change in spontaneous and piezoelectric polarizations between the two active layers. Electrons trapped in a quantum well that results from the bandgap difference between the respective first and second active layer 102 and 106 are thus free to move laterally in two (horizontal) dimensions but are tightly confined in the third (vertical) dimension.

In the context of the present disclosure, the term "in-situ" refers to a process that is carried out within a single tool or reaction chamber without exposing the wafer to the environment outside the tool or chamber. Further, the term "ex-situ" may refer to a process that is not carried out in a single tool. In another embodiment, formation of passivation layer 108 may be carried out using metal-organic chemical vapor decomposition (MOCVD) after formation of the first and second active layers 102 and 106, respectively. In other words, the passivation layer 108 may be deposited in-situ with the first and second active layers 102 and 106, respectively.

It is appreciated that first active layer 102 is typically disposed over a substrate (not shown) formed of any one of a number of different materials, such as sapphire (Al₂O₃), silicon (Si), GaN, or silicon carbide (SiC). In one embodiment, first active layer 102 comprises an epitaxial GaN layer. To avoid possible problems with lattice mismatch and/or differences in thermal coefficients of expansion, one or more additional layers may be disposed between first active layer 102 and the underlying substrate. For example, an optional thin nucleation layer may be formed between the substrate and first active layer 102. In other examples, first active layer 102 may comprise different semiconductor materials containing various nitride compounds of other Group III elements. In addition, a thin (~1 nm) layer of AlN may be formed on top of first active layer 102 prior to formation of second active layer 106. First active layer 102 may be grown or deposited on the substrate.

The second active layer 106 is disposed on the first active layer 102. In the example of FIG. 1; second active layer 106 comprises aluminum gallium nitride (AlGaN). In other examples, different Group III nitride semiconductor materials such as aluminum indium nitride (AlInN) and aluminum indium gallium nitride (AlInGaN) may be used for second active layer 106. In other embodiments, the material of second active layer 106 may be a non-stoichiometric compound. In such materials, the ratios of the elements are not easily represented by ordinary whole numbers, For example, the second active layer 106 may be a non-stoichiometric compound of a Group III nitride semiconductor material such as $Al_XGa_{1-X}N$, where $0<X<1$. In one implementation, second active layer 106 comprises AlGaN (Al 25%) having a thickness of about 20 nanometers (nm) thick. A thin (~1 nm) termination layer of GaN may be optionally formed on top of second active layer 106 prior to formation of passivation layer 108. The second active layer 106 may be grown or deposited on the first active layer 102.

As shown in FIG. 1, passivation layer 108 is disposed on second active layer 106. As discussed above, in one embodiment, passivation layer 108 comprises aluminum silicon nitride (AlSiN). In one example, the thickness of passivation 108 may be in an approximate range of 1-10 nanometers (nm) thick. Further, in one implementation passivation layer 108 is substantially 5-10% of aluminum (Al) to silicon nitride (SiN) and formed between 1-10 nm thick. As previously discussed, passivation layer 108 may be deposited in-situ with the first and second active layers 102 and 106, respectively, and utilized to passivate the GaN-based active layers. In one example, passivation layer 108 has purity, density, and strength characteristics similar to a layer grown in-situ using MOCVD. For example, a layer grown in-situ generally has greater purity, higher strength, and higher density as compared to a layer grown ex-situ. Further, passivation layer 108 may also be utilized as a gate dielectric layer.

Passivation layer 108 separates gate 112 from second active layer 106. As shown, gate 112 is disposed atop passivation layer 108. In one embodiment, gate 112 comprises a gold nickel (NiAu) alloy. In another embodiment, gate 112 comprises a titanium gold (TiAu) alloy or molybdenum gold MoAu alloy. In other examples, gate 112 may comprise a gate electrode and gate field plate. In operation, gate 112 controls the forward conduction path between respective source and drain ohmic contacts 114 & 116. In the example of FIG. 1, the portion of gate 112 which is above passivation layer 108 and extends laterally towards ohmic drain contact 116 serves as a gate field plate, which functions to alleviate the electric field intensity at an edge (closest to ohmic drain contact 116).

Ohmic contacts 114 and 116 are disposed through passivation dielectric layer 108 to contact second active layer 106. Ohmic contact 114 is one example of a source contact, while ohmic contact 116 is one example of a drain contact. In one embodiment, ohmic contacts 114 and 116 may be formed by etching openings in passivation layer 108, followed by a metal deposition and annealing steps.

As shown, FIG. 1 illustrates the device structure at a point in the fabrication process just after formation of gate 112 and ohmic metal contacts 114 and 116, which respectively comprise source and drain electrodes of Gail HFET device 100. FIG. 1 shows ohmic metal contacts 114 and 116 formed directly on passivation layer 108. In other embodiments, ohmic metal contacts 114 and 116 may be formed in recesses which extend vertically downward into the second active layer 106. In still other embodiments, ohmic metal contacts 114 and 116 may be formed in recesses that extend vertically downward through second active layer 106 to contact the first active layer 102.

When semiconductor device 100 is configured for use as a power switch, gate 112 and ohmic contacts 114 and 116 are typically coupled through terminals to form electrical connections to external circuits. In operation, electric charge in 2DEG layer 104 flows laterally between ohmic contacts 114 and 116 to become a current in an external circuit. The electric charge flow, and hence the current, may be controlled by a voltage from an external circuit that is electrically connected between the gate 112 and ohmic contact 114.

As used in this disclosure, an electrical connection is an ohmic connection. An ohmic connection is one in which the relationship between the voltage and the current is substantially linear and symmetric for both directions of the current. For example, two metal patterns that contact each through only metal are electrically connected. In contrast, ohmic contacts 114 and 116 are not electrically connected to each other in semiconductor device 100 because any connection between these two contacts is through a channel in the semiconductor material, which conduction path is controlled by gate 112. Similarly, gate 112 is not electrically connected to second active layer 106 since passivation layer 108 insulates gate 112 from the underlying active layers.

As discussed above, utilizing AlSiN as passivation layer 108 helps to alleviate the adverse effects of accumulated surface charge during the fabrication and/or handling of the device 100. In addition, utilizing AlSiN as passivation layer 108 in the HFET structure described herein may minimize current collapse during switching, reduce gate leakage, and provide enhanced gate reliability and stability. Further, passivation layer 108 may also be utilized as a gate dielectric layer.

Figure 2:
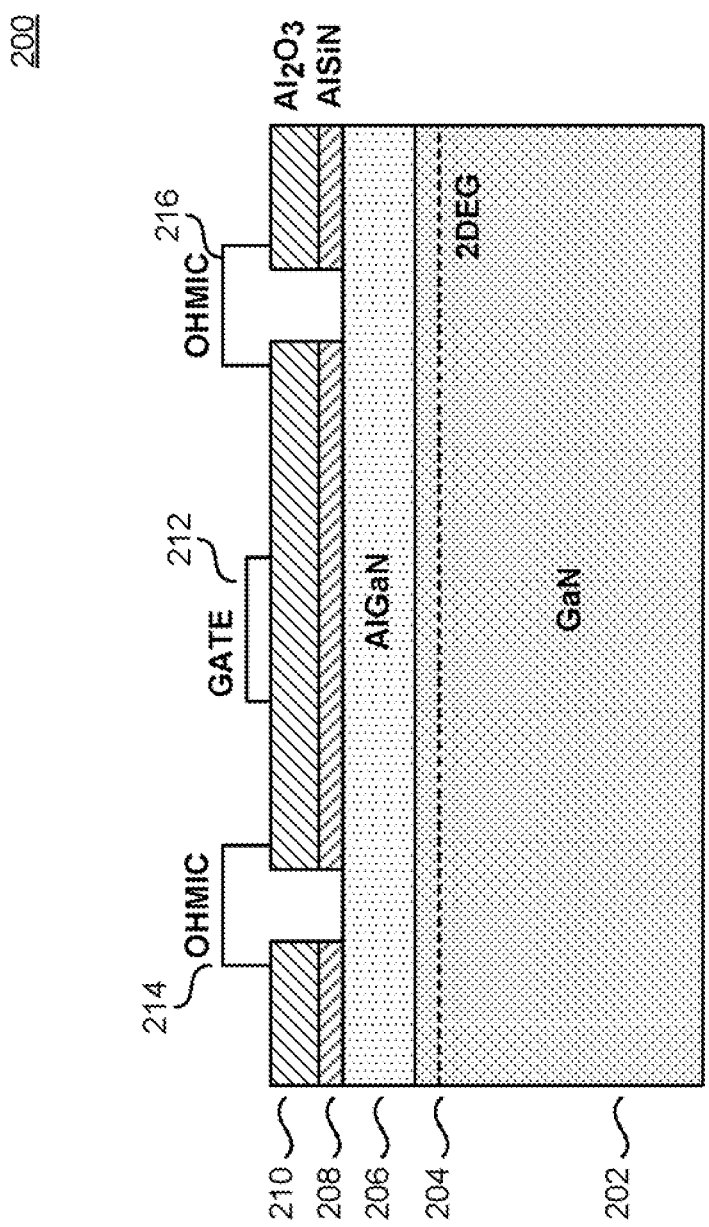
FIG. 2 is a cross-sectional side view of an example semiconductor device having another passivation structure.

FIG. 2 illustrates a cross-sectional side view of an example semiconductor device (HFET device) 200 which includes a first active layer 202, a second active layer 206, and a 2DEG layer 204 formed there between. Also shown are a passivation/first gate dielectric layer 208, a second gate dielectric 210, a gate 212, and respective source and drain ohmic contacts 214 and 216. Semiconductor device 200 shown in FIG. 2 is the similar to semiconductor device 100 of FIG. 1, except that HFET device 200 includes a second gate dielectric layer 210 atop passivation layer 218. Second gate dielectric layer 210 is disposed on passivation/first gate dielectric layer 208 and laterally surround respective source and drain ohmic contacts 114 and 116, as well as gate 112. Further, passivation/first gate dielectric layer 208 is similar to passivation layer 108, however is referred to as "passivation/first gate dielectric layer" to emphasize that the passivation layer 208 may also be utilized as one layer of multiple gate dielectric layers.

As shown, second gate dielectric layer 210 is disposed on passivation/first gate dielectric layer 208. In one example, second gate dielectric layer 210 comprises aluminum oxide ($Al_2O_3$). In still further examples, other oxide materials, such as ZrO, HfO, $SiO_2$ and GdO, may be utilized for the second gate dielectric layer 210. In one embodiment, second gate dielectric layer 210 has a thickness in the range of approximately 10-20 nm thick. In one embodiment, second gate dielectric layer 210 is thicker than passivation/first gate dielectric layer 208. For example, the thickness of passivation/first gate dielectric layer 208 may be in a range of approximately 1-10 nm. In one example fabrication process, second gate dielectric layer 210 may be deposited ex-situ from respective first and second active layers 202 & 206 utilizing atomic layer deposition (ALD).

As shown, passivation/first gate dielectric layer 208 and second gate dielectric layer 210 vertically separate gate 212 from second active layer 206. In certain embodiments, gate 212 may comprise a gate electrode and a gate field plate member. In the example of FIG. 2, the portion of gate 212 which is above the second passivation layer 218 and extends laterally towards drain ohmic contact 216 serves as a gate field plate member, which functions to alleviate the electric field intensity at an edge (closest to drain ohmic contact 216).

As shown, source and drain ohmic contacts 214 and 216 are respectively disposed on opposite lateral sides of gate 212. Ohmic contacts 214 and 216 extend vertically the second gate dielectric layer 210 and passivation/first gate dielectric layer 208 to contact second active layer 206. In one embodiment, ohmic contacts 214 and 216 may be formed by etching openings in the second gate dielectric layer 210 and passivation/first gate dielectric layer 208, followed by a metal deposition and annealing steps. In another example fabrication process, ohmic contacts 214 and 216 may be formed before the deposition of second gate dielectric layer 210.

Further, passivation/first gate dielectric layer 208 may be utilized as one gate dielectric layer along with second gate dielectric layer 210. Practitioners in the art will appreciate that utilizing multiple gate dielectric layers in the manner described herein may advantageously produce higher critical voltage operation of the resulting HFET device. The critical voltage, $V_{CRIT}$, is defined as the gate-to-source voltage. $V_{GS}$, at which there is a relatively sharp rise in the gate leakage current. In addition, the use of multiple gate dielectric layers may improve the thermal stability of semiconductor device 200 as compared to a device utilizing only a single gate dielectric layer. Thermal stability relates to how much the gate leakage current of the device increases with temperature.

Figure 3:
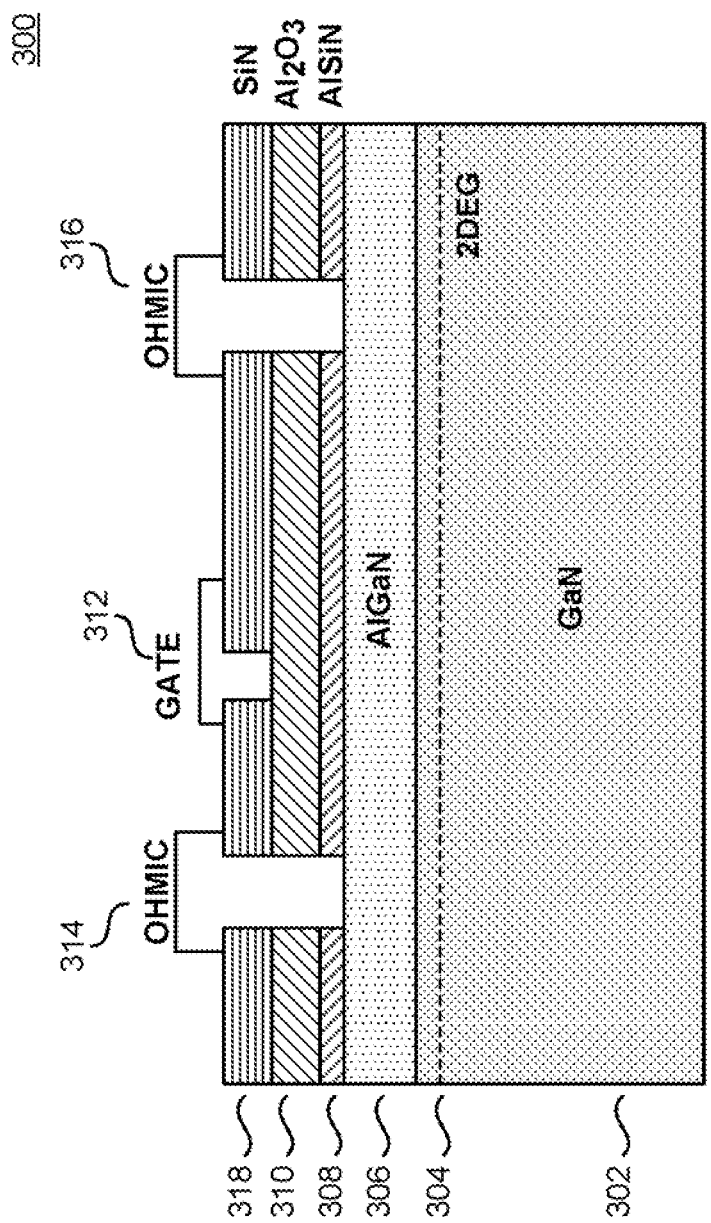
FIG. 3 is a cross-sectional side view of an example semiconductor device having a further passivation structure.

FIG. 3 illustrates a cross-sectional side view of an example semiconductor device (HFET device) 300 which includes a first active layer 302, a second active layer 306; and a 2DEG layer 304 formed therebetween. Also shown are a passivation/first gate dielectric layer 308, a second gate dielectric 310, an upper passivation layer 318, a gate 312, and respective source and drain ohmic contacts 314 and 316. Semiconductor device 300 shown in FIG. 3 is similar to the semiconductor device 100 of FIGS. 1 and 200 of FIG. 2, except that HFET device 300 includes upper passivation layer 318. Upper passivation layer 318 is disposed on second gate dielectric 310 and laterally surround respective source and drain ohmic contacts 314 and 316, as well as gate 312. Further, passivation/first gate dielectric layer 308 is similar to passivation layer 108, however is referred to as "passivation first gate dielectric layer" to emphasize that the passivation layer 1 first gate dielectric layer 308 may also be utilized as one layer of multiple gate dielectric layers.

In one embodiment, upper passivation layer 318 may comprise a dielectric material such as silicon nitride (SiN). In other embodiments, upper passivation layer 318 may comprise multiple layers of material. It is appreciated that upper passivation layer 318 provides stability of the electrical characteristics of HFET device 300 by isolating the surface of the device from electrical and chemical contaminants in the surrounding environment. Upper passivation layer 218 may be deposited through chemical vapor deposition such as low pressure chemical vapor deposition (LPCVD) or plasma-enhanced chemical vapor deposition (PECVD).

As shown, upper passivation layer 318, passivation/first gate dielectric layer 308 and second gate dielectric layer 310 vertically separate gate 312 from second active layer 306. In certain embodiments, gate 312 may comprise a gate electrode and a gate field plate member. As shown, gate 312 extends vertically through an opening formed in upper passivation layer 318 to contact second gate dielectric layer 210. In an example fabrication process, gate 312 may be formed by etching an opening in upper passivation layer 318, followed by a gate metal deposition. In the example of FIG. 3, the portion of gate 312 which is above the upper passivation layer 318 and extends laterally towards drain ohmic contact 316 serves as a gate field plate member, which functions to alleviate the electric field intensity at an edge (closest to drain ohmic contact 316).

As shown, source and drain ohmic contacts 314 and 316 are respectively disposed on opposite lateral sides of gate 312. Ohmic contacts 314 and 316 extend vertically through upper passivation layer 318, second gate dielectric layer 310, and passivation first gate dielectric layer 308 to contact second active layer 306. In one embodiment ohmic contacts 314 and 316 may be formed by etching openings in upper passivation layer 318, second gate dielectric layer 310, and passivation/first gate dielectric layer 308, followed by a metal deposition and annealing steps. In another example fabrication process, ohmic contacts 314 and 316 may be formed before the deposition of second gate dielectric layer 310 and the upper passivation layer 318.

Figure 4:
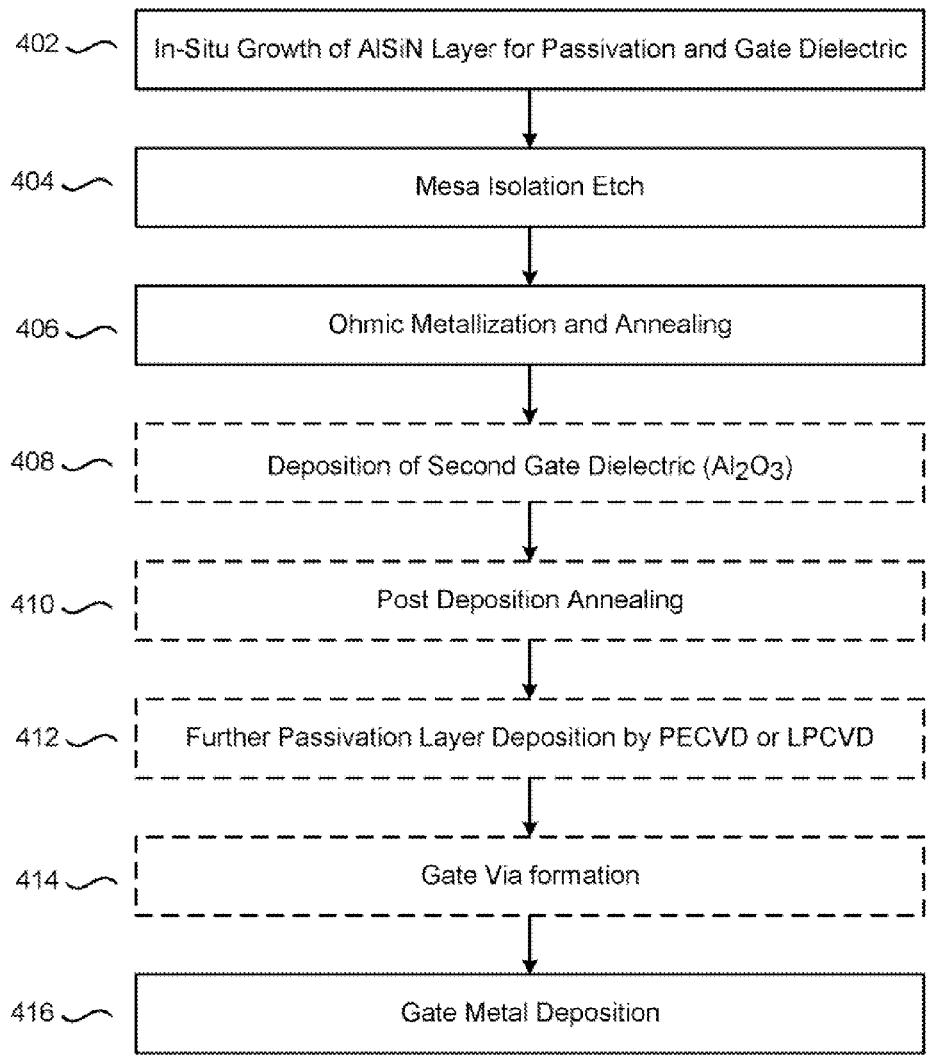
FIG. 4 is a flow diagram illustrating an example process flow for fabricating a semiconductor device structure.

FIG. 4 illustrates an example process flow 400 for constructing a semiconductor device such as HFET devices 100, 200, or 300 respectively shown in FIGS. 1, 2, and 3. In the example shown, the process starts after the completion of the epitaxial growth or deposition of the first and second active layers on the substrate. Formation of the passivation layer (also referred to as the passivation/first gate dielectric layer above) comprising AlSiN is carried out in-situ after growth of the GaN/AlGaN active layers (block 402). In one embodiment, the passivation layer is deposited using a MOCVD technique carried out at a temperature range between 800-900° C. with a reactor pressure of about 100 Torrs. In one embodiment a passivation layer comprising AlSiN is grown with a MOCVD technique using silane ($SiH_4$), ammonia ($NH_3$) and trimethylaluminum (TMAl) as precursors for the AlSiN. Hydrogen ($H_2$) and nitrogen ($N_2$) may be used as carrier gases A total flow of about 50 l/min. with $NH_3$ flow in a range of about 1-10 l/min., $SiH^4$ of about 1 l/min., and TMAl flow in a range of about 5-20 sccm. The $NH_3$ flow is maintained so that the integrated N composition is maintained at stoichiometry between $Si_3N_4$ and AlN as monitored by the overall refractive index and the density of the AlSiN film.

The passivation layer is formed to a thickness in a range of approximately 1-10 nm, and is continuous over the surface of the wafer, In one embodiment, the thickness of the passivation layer is about 5 nm. In still another embodiment, the passivation layer is formed in-situ with the first and second active layers. For example, the same MOCVD machine that is used to form the first and second active layers may also be used to form the passivation/first gate dielectric layer. In one example, the passivation layer/first gate dielectric layer has purity, density, and strength characteristic to a layer grown in-situ using MOCVD. For example, a layer grown in-situ generally has greater purity, higher strength, and higher density to a layer grown ex-situ.

After growth of the passivation layer, the surface of the passivation layer undergoes mesa isolation etching to define the active region of the ohmic contacts (block 404). The mesa isolation may be performed utilizing a reactive-ion etching (RIE) system. In other fabrication methods, the mesa isolation may be performed using inductively coupled plasma (ICP) RIE, At this point in the process flow, ohmic via openings may optionally be formed through the passivation layer, followed by ohmic metallization and annealing (block 406).

An example ohmic contact metal is TiAlMoAu. The metal ohmic contacts may be annealed utilizing a RTA tool at a temperature range of approximately 600-900 ° C. for about one minute.

Next, the second gate dielectric layer which may be comprised of $Al_2O_3$ may be optionally deposited on the passivation layer (block 408). The second gate dielectric layer may also be deposited over the source and drain ohmic contacts. In one embodiment, the second gate dielectric layer is deposited on the wafer surface using ALD at 300° C. The second gate dielectric layer may be grown to a thickness in a range of approximately 10-20 nm.

In one embodiment, the deposition of the second gate dielectric layer may be performed ex-situ from the first and second active layers and the passivation / first gate dielectric layer. For example, both the passivation/first and second gate dielectric layers may be deposited on the wafer surface using the same ALD chamber or other machine or system.

A high temperature anneal may be performed after the second gate dielectric layer has been deposited (block 410) to improve the film and interface quality of the second gate dielectric layer. By way of example, the annealing step may be performed in a furnace at temperature range of 450-750° C. for approximately 5-10 minutes. Annealing may also be performed using a number of different tools, such as a rapid temperature annealing (RTA) tool. It should be appreciated that block 408 and block 410 are considered optional, as the blocks apply to the HFET devices shown in FIGS. 2 and 3, which illustrate a second gate dielectric layer.

After annealing, an upper passivation layer may be optionally deposited over the second gate dielectric layer (block 412). In one embodiment, the upper passivation layer may be deposited using PECVD. The upper passivation layer may also be deposited using LPCVD. The upper passivation layer is typically formed to a thickness in a range of approximately 100-150 nm. As discussed above, the upper passivation layer may comprise silicon nitride (SiN) or other materials having similar properties.

Gate via formation is shown in block 314. This step is optionally performed when an upper passivation layer has been formed over the stack of multiple gate dielectric layers. Gate via formation comprises masking and etching the upper passivation layer such that an opening is formed through the upper passivation layer, thereby exposing the underlying second gate dielectric layer. In one embodiment, dry etching may be utilized with a gas such as $CF_4$ or $SF_6$ to etch through the upper passivation layer. After the etching process exposes the second gate dielectric layer, a gate metal or metal alloy deposition (block 316) is performed to fill the etched opening. In one example, NiAu is used as the gate metal. As shown in FIGS. 1, 2, and 3, a field plate portion of the gate may be formed by masking or etching the gate metal such that a top portion laterally extends over the upper passivation layer towards the farthest (drain) ohmic contact. It should be appreciated that blocks 412 and 414 are considered optional, as the blacks apply to the HFET device 300 shown in FIG. 3, which illustrates an upper passivation layer.

Persons of ordinary skill in the semiconductor arts will understand that other standard post-fabrication or back-end processing steps may be performed, including forming metal (e.g., patterned lines or traces) on the surface of the wafer, wafer backgrinding (also called backlapping or wafer thinning), die separation, and packaging.

Figure 5:
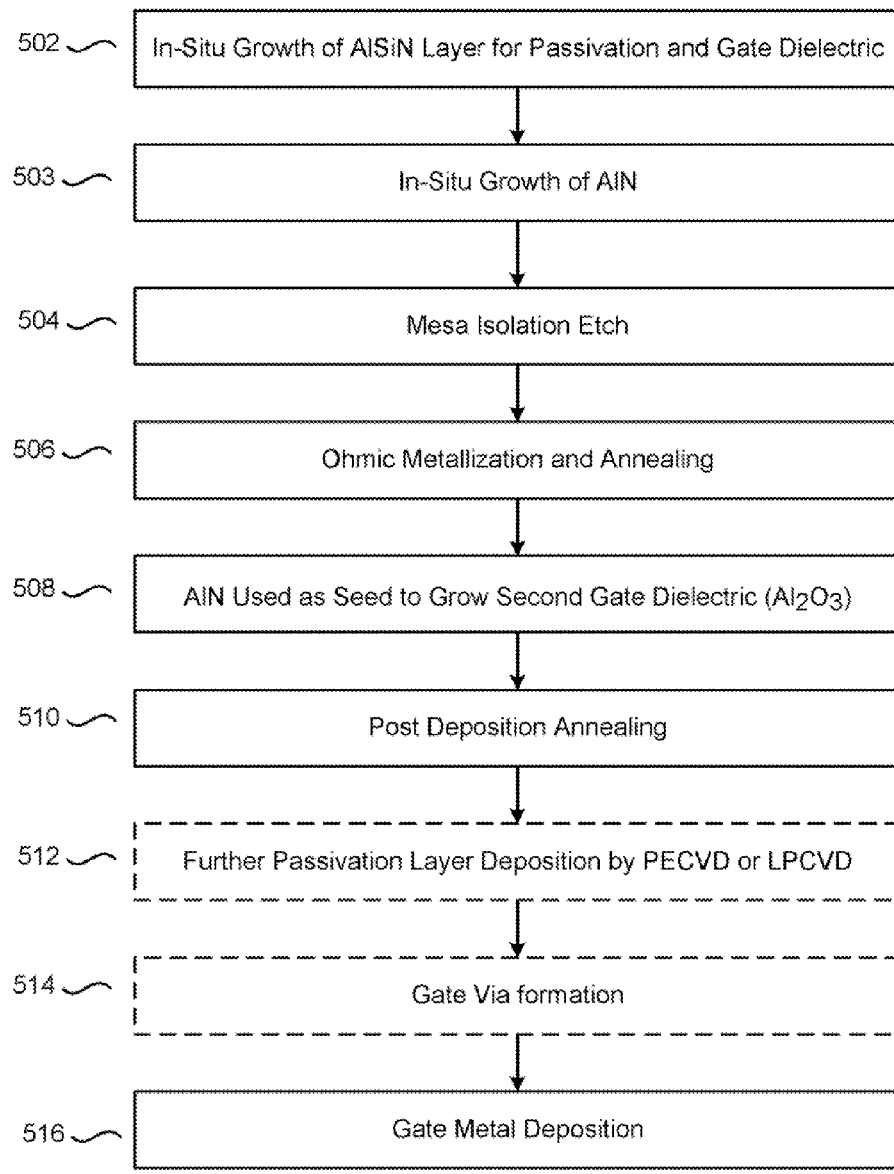
FIG. 5 is a flow diagram illustrating another example process flow for fabricating a semiconductor device structure.

FIG. 5 is a diagram illustrating another example process flow 400 for constructing a HFET device such as semiconductor device 200 or 300 shown in FIGS. 2 and 3. The process shown in FIG. 5 is the same as that discussed in connection with FIG. 4, with like numbered steps being the same as described above, except that process flow 500 includes additional block 503 interposed between block 502 and block 504. After the in-situ grown of the AlSiN passivation/first gate dielectric layer, aluminum nitride (AlN) is grown on top of the AlSiN layer (block 503). In one embodiment, the AlN layer is grown in-situ with the AlSiN passivation/first gate dielectric layer and first and second active layers. The thickness of the AlN layer may be about 1 nm thick. After mesa isolation etching and ohmic metallization and annealing in blocks 504 and 506, the AlN layer is effectively utilized as a seed layer to form the Al₂O₃ second gate dielectric layer (block 508).

The above description of illustrated example embodiments, including what is described in the Abstract, are not intended to be exhaustive or to be limitation to the precise forms disclosed. While specific embodiments and examples of the subject matter described herein are for illustrative purposes, various equivalent modifications are possible without departing from the broader spirit and scope of the present invention. Indeed, it is appreciated that the specific example thicknesses, material types, temperatures, voltages, times, etc., are provided far explanation purposes and that other values may also be employed in other embodiments and examples in accordance with the teachings of the present invention.

We claim:

1. A heterostructure power transistor comprising:
   a first active layer,
   a second active layer disposed on the first active layer, a two-dimensional electron gas layer forming between the first and second active layers;
   a passivation/gate dielectric layer comprising aluminum silicon nitride (AlSiN) disposed on the second active layer;
   an AlN layer disposed above the passivation/gate dielectric layer;
   a gate;
   a second gate dielectric layer disposed on the AlN layer, the gate being disposed above the second gate dielectric layer;
   first and second ohmic contacts that electrically connect to the second active layer, the first and second ohmic contacts being laterally spaced-apart, the gate being disposed between the first and second ohmic contacts.

2. The heterostructure power transistor of claim 1 wherein the second gate dielectric layer comprises aluminum oxide (Al₂O₃).

3. The heterostructure power transistor of claim 1 further comprising an upper passivation layer disposed over the second gate dielectric layer, the gate extending vertically through the upper passivation layer to contact the second gate dielectric layer.

4. The heterostructure power transistor of claim 1 wherein the passivation/gate dielectric layer has a first thickness and the second gate dielectric has a second thickness, the second thickness being larger than the first thickness.

5. The heterostructure power transistor of claim 1 wherein the first and second ohmic contacts extend vertically through the second gate dielectric layer and the passivation/gate dielectric layer.

6. The heterostructure power transistor of claim 3 wherein the first and second ohmic contacts extend vertically through the upper passivation layer, the second gate dielectric layer, and the passivation/gate dielectric layer.

7. The heterostructure power transistor of claim 1 wherein the passivation/gate dielectric layer has a first thickness in a range of about 1-5 nanometers thick.

8. The heterostructure power transistor of claim 1 wherein the second gate dielectric has a second thickness in a range of about 10-20 nanometers thick.

9. The heterostructure power transistor of claim 1 wherein the first and second ohmic contacts respectively comprise source and drain ohmic contacts.

10. The heterostructure power transistor of claim 3 wherein the upper passivation layer comprises SiN.

11. The heterostructure power transistor according to claim 1 wherein the first active layer comprises gallium nitride (GaN).

12. The heterostructure power transistor of claim 1 wherein the second active layer comprises aluminum gallium nitride (AlGaN).

13. The heterostructure power transistor of claim 1 wherein the first and second active layers are defined as an isolated mesa.

14. A method of fabricating a heterostructure semiconductor device comprising:
   forming a first active layer on a substrate;
   forming a second active layer on the first active layer, the first active layer and the second active layer having different bandgaps such that a two-dimensional electron gas layer is formed therebetween;
   forming a passivation/gate dielectric layer comprising aluminum silicon nitride (AlSiN) on the second active layer, the passivation/gate dielectric layer having a first thickness, wherein the forming of the passivation/gate dielectric layer comprises growing in-situ with the AlSiN layer an AlN layer on top of the AlSiN layer;
   forming a second gate dielectric layer of aluminum oxide over the passivation/gate dielectric layer using the AlN layer as a seed layer;
   forming first and second ohmic contacts that each extend vertically through the passivationfgate dielectric layer, the first and second ohmic contacts being laterally spaced-apart and electrically connected to the second active layer; and
   forming a gate at a lateral position between the first and second ohmic contacts.

15. The method of claim 14 wherein the second gate dielectric layer has a second thickness greater than the first thickness.

16. The method of claim 15 further comprising depositing an upper passivation layer over the second gate dielectric layer.

17. The method of claim 14 wherein the first active layer comprises gallium nitride.

18. The method of claim 14 wherein the second active layer comprises aluminum gallium nitride.

19. The method of claim 14 wherein the passivation/gate dielectric layer is formed in-situ with the first and second active layers.

20. The method of claim 14 wherein forming the passivation/gate dielectric layer comprising aluminum silicon nitride (AlSiN) comprises growing the aluminum silicon nitride (AlSiN) with an integrated nitrogen composition that is at stoichiometry between $Si_3N_4$ and AlN.

21. The method of claim 14 wherein forming the passivationfgate dielectric layer comprising aluminum silicon nitride (AlSiN) comprises forming the aluminum silicon nitride (AlSiN) with substantially 5-10% of aluminum (Al) to silicon nitride (SiN).

22. The heterostructure power transistor of claim 1, wherein the aluminum silicon nitride (AlSiN) has an integrated nitrogen composition that is at stoichiometry between $Si_3N_4$ and AlN.

23. The heterostructure power transistor of claim 1 wherein the aluminum silicon nitride (AlSiN) has substantially 5-10% of aluminum (Al) to silicon nitride (SiN).

* * * * *